(12) United States Patent
Wloczysiak

(10) Patent No.: US 12,021,597 B2
(45) Date of Patent: Jun. 25, 2024

(54) CIRCUITS, DEVICES AND METHODS RELATED TO PHASE SHIFTER TUNING IN CARRIER AGGREGATION

(71) Applicant: SKYWORKS SOLUTIONS, INC., Irvine, CA (US)

(72) Inventor: Stephane Richard Marie Wloczysiak, Irvine, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

(21) Appl. No.: 17/562,289

(22) Filed: Dec. 27, 2021

(65) Prior Publication Data

US 2022/0247478 A1 Aug. 4, 2022

Related U.S. Application Data

(60) Provisional application No. 63/133,190, filed on Dec. 31, 2020.

(51) Int. Cl.
*H04B 7/08* (2006.01)
*H03F 3/19* (2006.01)
(Continued)

(52) U.S. Cl.
CPC ......... *H04B 7/0868* (2013.01); *H04B 1/0057* (2013.01); *H04B 1/16* (2013.01);
(Continued)

(58) Field of Classification Search
CPC ......... H03F 2200/294; H03F 2200/451; H03F 3/19; H04B 1/0057; H04B 1/0458; H04B 1/16; H04B 1/18; H04B 7/0868
See application file for complete search history.

(56) References Cited

U.S. PATENT DOCUMENTS

2013/0064271 A1 3/2013 van de Beek et al.
2015/0295596 A1* 10/2015 Wloczysiak ............. H04L 5/08
370/297
(Continued)

FOREIGN PATENT DOCUMENTS

KR 10-2017-0048434 A 5/2017

OTHER PUBLICATIONS

International Search Report dated Apr. 26, 2022 for PCT/US2021/065203.
Written Opinion dated Apr. 26, 2022 for PCT/US2021/065203.

*Primary Examiner* — Nguyen T Vo
(74) *Attorney, Agent, or Firm* — Chang & Hale LLP

(57) ABSTRACT

A carrier aggregation circuit can include a mid-band path having a filter assembly and a phase shifting circuit, to support one or more frequency bands. The circuit can further include first and second high-band paths each being configured to support a frequency band and having a filter and a phase shifting circuit. Selected high-band filter and the mid-band filter assembly can be configured to provide impedances having the same sign for imaginary parts, and the phase shifting circuit of the mid-band path can be configured to provide a desired reflection coefficient phase at one of the first and second high-band frequency bands. The circuit can further include a common node coupled to outputs of the mid-band, first high-band and second high-band paths, and a tuning circuit implemented to remove the imaginary part of the impedance of the mid-band filter assembly at the frequency band of the selected high-band filter.

23 Claims, 15 Drawing Sheets

(51) Int. Cl.
　　*H04B 1/00*　　　(2006.01)
　　*H04B 1/16*　　　(2006.01)

(52) U.S. Cl.
　　CPC .......... *H03F 3/19* (2013.01); *H03F 2200/294* (2013.01); *H03F 2200/451* (2013.01)

(56) References Cited

U.S. PATENT DOCUMENTS

| | | |
|---|---|---|
| 2016/0112072 A1 | 4/2016 | Bauder |
| 2016/0127014 A1* | 5/2016 | Wloczysiak ............. H04B 1/18 375/318 |
| 2017/0244432 A1 | 8/2017 | Ranta et al. |
| 2017/0317710 A1 | 11/2017 | Liu et al. |
| 2018/0062582 A1* | 3/2018 | Pehlivanoglu .......... H03F 3/213 |
| 2018/0076834 A1* | 3/2018 | Wloczysiak ......... H04M 11/062 |

* cited by examiner

CIRCUITS, DEVICES AND METHODS RELATED TO PHASE SHIFTER TUNING IN CARRIER AGGREGATION

CROSS-REFERENCE TO RELATED APPLICATION(S)

This application claims priority to U.S. Provisional Application No. 63/133,190 filed Dec. 31, 2020, entitled CIRCUITS, DEVICES AND METHODS RELATED TO PHASE SHIFTER TUNING IN CARRIER AGGREGATION, the disclosure of which is hereby expressly incorporated by reference herein in its respective entirety.

BACKGROUND

Field

The present disclosure relates to carrier aggregation in radio-frequency applications.

Description of the Related Art

In some radio-frequency (RF) applications, cellular carrier aggregation (CA) can involve two or more RF signals being processed through a common path. For example, carrier aggregation can involve use of a path for a plurality of bands having frequency ranges that are sufficiently separated. In such a configuration, simultaneous operation of more than one band can be achieved.

SUMMARY

In accordance with a number of implementations, the present disclosure relates to a carrier aggregation circuit that includes a mid-band path having an input and an output, and configured to support one or more mid-band frequency bands. The mid-band path includes a mid-band filter assembly and a phase shifting circuit. The carrier aggregation circuit further includes a first high-band path and a second high-band path, with each high-band path being configured to support a respective high-band frequency band and including an input and an output, and a respective high-band filter and a respective phase shifting circuit. Selected one of the first and second high-band filters and the mid-band filter assembly is configured to provide respective impedances having the same sign for respective imaginary parts. The phase shifting circuit of the mid-band path is configured to provide a desired reflection coefficient phase at one of the first and second high-band frequency bands. The carrier aggregation circuit further includes a common node coupled to the output of each of the mid-band path, the first high-band path and the second high-band path, and a tuning circuit implemented to remove or reduce the imaginary part of the impedance of the mid-band filter assembly at the high-band frequency band associated with the selected high-band filter.

In some embodiments, the one or more mid-band frequency bands can include a first mid-band frequency band and a second mid-band frequency band. The first mid-band frequency band can be, for example, B3 band, and the second mid-band frequency band can be, for example, B66 band.

In some embodiments, the mid-band filter assembly can include a mid-band filter for the first mid-band frequency band, and a second mid-band filter for the second mid-band frequency. The mid-band filter and the second mid-band filter can be implemented as a mid-band diplexer.

In some embodiments, the impedance of each of the selected high-band filter and the mid-band filter assembly can have a negative imaginary part to provide a capacitive response. The tuning circuit can be configured to provide an impedance having a positive imaginary part to remove or reduce the negative imaginary part of the impedance of the mid-band filter assembly at the high-band frequency band associated with the selected high-band filter. The tuning circuit can include an inductor that couples the common node to ground to provide an inductive response.

In some embodiments, each of the mid-band, first high-band and second high-band paths can include a switch to allow some or all of the paths to support one or more carrier-aggregation operations, or a non-carrier-aggregation operation through each path. In some embodiments, the tuning circuit can include a switch to allow the tuning circuit to be coupled to the common node during the one or more carrier-aggregation operations, or to be uncoupled from the common node during a non-carrier-aggregation operation.

In some teachings, the present disclosure relates to a method for carrier aggregating signals. The method includes supporting a signal in a mid-band frequency band through a mid-band filter assembly and a phase shifting circuit. The method further includes supporting a signal in a first high-band frequency band through a high-band filter and a phase shifting circuit, and supporting a signal in a second high-band frequency band through a high-band filter and a phase shifting circuit, such that selected one of the first and second high-band filters and the mid-band filter assembly provide respective impedances having the same sign for respective imaginary parts, and the phase shifting circuit for the mid-band frequency band provides a desired reflection coefficient phase at a selected one of the first and second high-band frequency bands. The method further includes combining the signals of the mid-band frequency band, the first high-band frequency band and the second high-band band at a common node, and providing tuning for some or all of the signals to remove or reduce the imaginary part of the impedance of the mid-band filter assembly at the high-band frequency band associated with the selected high-band frequency band.

In some embodiments, the mid-band frequency band can include either or both of, for example, B3 and B66 bands. In some embodiments, the impedance of each of the selected high-band filter and the mid-band filter assembly can have a negative imaginary part to provide a capacitive response. The tuning can provide an impedance having a positive imaginary part to remove or reduce the negative imaginary part of the impedance of the mid-band filter assembly at the high-band frequency band associated with the selected high-band filter. In some embodiments, the tuning can include providing an inductance between the common node ground to provide an inductive response. In some embodiments, the providing of the inductance can include performing a switching operation to provide or remove the inductance between the common node and the ground.

In some implementations, the present disclosure relates to a radio-frequency module that includes a packaging substrate configured to receive a plurality of components, and a carrier-aggregation circuit implemented on the packaging substrate. The carrier-aggregation circuit includes a mid-band path having an input and an output, and configured to support one or more mid-band frequency bands. The mid-band path includes a mid-band filter assembly and a phase shifting circuit. The carrier-aggregation circuit further includes a first high-band path and a second high-band path, with each high-band path being configured to support a respective high-band frequency band and including an input and an output, and a respective high-band filter and a respective phase shifting circuit. Selected one of the first and second high-band filters and the mid-band filter assembly is configured to provide respective impedances having the same sign for respective imaginary parts, and the phase shifting circuit of the mid-band path is configured to provide a desired reflection coefficient phase at one of the first and second high-band frequency bands. The carrier-aggregation circuit further includes a common node coupled to the output of each of the mid-band path, the first high-band path and the second high-band path. The carrier-aggregation circuit further includes a tuning circuit implemented to remove or reduce the imaginary part of the impedance of the mid-band filter assembly at the high-band frequency band associated with the selected high-band filter.

In some embodiments, the carrier-aggregation circuit can be configured to support receive operations.

In some implementations, the present disclosure relates to a wireless device that includes a receiver configured to process radio-frequency signals, and a carrier-aggregation circuit in communication with the receiver. The carrier-aggregation circuit includes a mid-band path having an input and an output, and configured to support one or more mid-band frequency bands, with the mid-band path including a mid-band filter assembly and a phase shifting circuit. The carrier-aggregation circuit further includes a first high-band path and a second high-band path, with each high-band path being configured to support a respective high-band frequency band and including an input and an output, and a respective high-band filter and a respective phase shifting circuit. Selected one of the first and second high-band filters and the mid-band filter assembly is configured to provide respective impedances having the same sign for respective imaginary parts. The phase shifting circuit of the mid-band path is configured to provide a desired reflection coefficient phase at one of the first and second high-band frequency bands. The carrier-aggregation circuit further includes a common node coupled to the output of each of the mid-band path, the first high-band path and the second high-band path. The carrier-aggregation circuit further includes a tuning circuit implemented to remove or reduce the imaginary part of the impedance of the mid-band filter assembly at the high-band frequency band associated with the selected high-band filter. The wireless device further includes an antenna in communication with the carrier-aggregation circuit. The antenna is configured to receive the radio-frequency signals.

In some embodiments, the one or more mid-band frequency bands, and the first and second high-band frequency bands can be cellular frequency bands. The one or more mid-band frequency bands can include a first mid-band frequency band and a second mid-band frequency band. The first mid-band frequency band can be, for example, B3 band, and the second mid-band frequency band can be, for example, B66 band. In some embodiments, the mid-band filter assembly can include a mid-band filter for the first mid-band frequency band, and a second mid-band filter for the second mid-band frequency.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
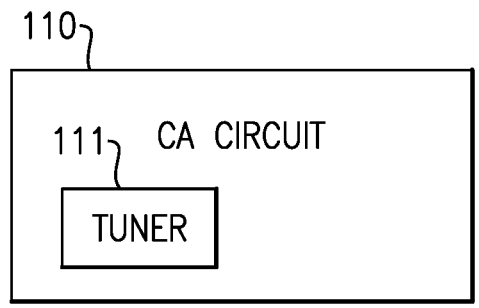
FIG. 1 depicts a carrier aggregation (CA) circuit having one or more features as described herein.

FIG. 1 depicts a carrier aggregation (CA) circuit 110 having one or more features as described herein. More particularly, in some embodiments, the carrier aggregation circuit 110 can include a tuner 111 configured to improve one or more performance parameters of the aggregation circuit 110.

It is noted that cellular carrier aggregation can be achieved by allowing two or more radio-frequency (RF) signals to be processed through a common path. For example, carrier aggregation can involve use of a path for a plurality of bands having frequency ranges that are sufficiently separated. In such a configuration, simultaneous operation of more than one band is possible.

In the context of a receiver, carrier aggregation can allow concurrent processing of RF signals in a plurality of bands to provide, for example, high data rate capability. In such a carrier aggregation system, it is desirable to maintain a low noise figure (NF) for each RF signal. When two bands being aggregated are close in frequency, maintaining sufficient separation of the two bands is also desirable.

Figure 2:
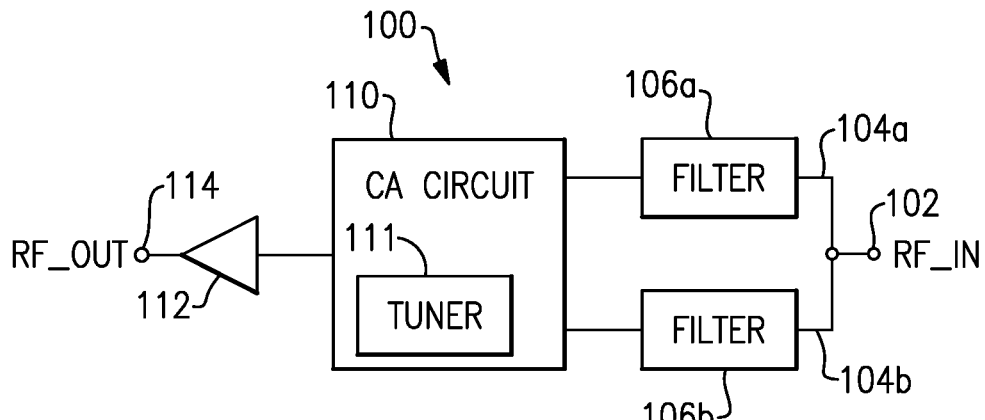
FIG. 2 shows a carrier aggregation configuration that includes the carrier aggregation circuit of FIG. 1 and configured to receive a plurality of inputs and provide an output.

FIG. 2 shows a carrier aggregation configuration 100 that includes the carrier aggregation circuit 110 of FIG. 1, and configured to receive a plurality of inputs and provide an output. The plurality of inputs can include, for example, a first RF signal and a second RF signal. The first RF signal can be provided to the carrier aggregation circuit 110 from a common input node 102 (RF_IN), through a first path 104a that includes a first filter 106a. Similarly, the second RF signal can be provided to the carrier aggregation circuit 110 from the common input node 102 (RF_IN), through a second path 104b that includes a second filter 106b.

As described herein, the carrier aggregation circuit 110 can be configured such that the output at a common output node 114 is a recombined RF signal that includes two separated frequency bands associated with the first and second RF signals. As also described herein, the carrier aggregation circuit 110 can be configured to provide desirable performance features such as low loss, low noise figure, and/or high isolation between the two signal paths 104a, 104b.

Various examples herein are described in the context of aggregating two frequency bands. However, it will be understood that one or more features of the present disclosure can be implemented in aggregation of more than two frequency bands.

In the example of FIG. 2, the carrier aggregation circuit 110 is shown to include a tuner 111 that can be implemented to improve one or more performance parameters of the carrier aggregation circuit 110, and therefore the carrier aggregation configuration 100. Examples associated with such a tuner are described herein in greater detail.

Figure 3:
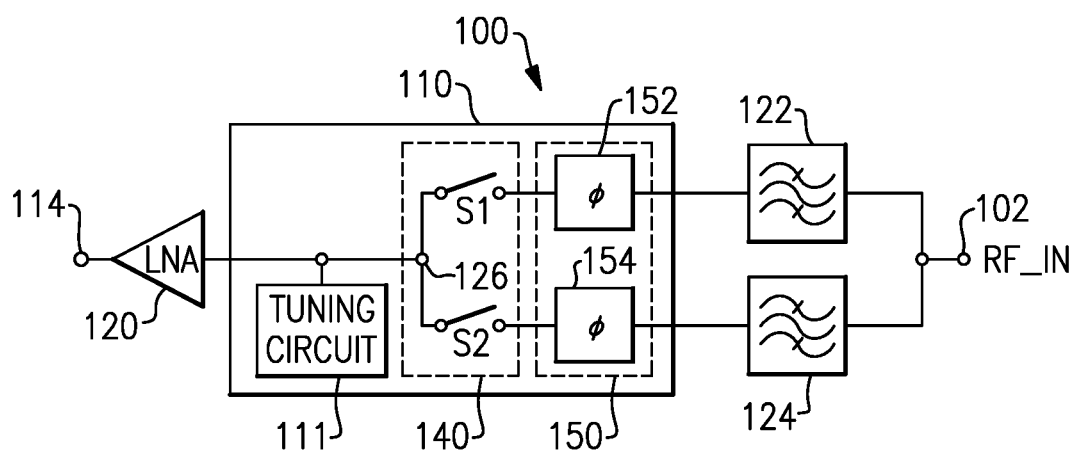
FIG. 3 shows a carrier aggregation configuration that can be a more specific example of the carrier aggregation configuration of FIG. 2.

FIG. 3 shows a carrier aggregation configuration 100 that can be a more specific example of the carrier aggregation configuration 100 of FIG. 2. In the example of FIG. 3, the amplifier 112 of FIG. 2 can be a low-noise amplifier (LNA) 120 in a receiver. In the example of FIG. 3, a carrier aggregation circuit 110 can be configured to receive a plurality of inputs and provide an output that is routed to the LNA 120 for amplification. The plurality of inputs can include a first RF signal and a second RF signal. The first RF signal can be provided to the carrier aggregation circuit 110 from a common input node 102 (RF_IN), through a first path that includes a first band-pass filter 122. Similarly, the second RF signal can be provided to the carrier aggregation circuit 110 from the common input node 102 (RF_IN), through a second path that includes a second band-pass filter 124. As described herein, the carrier aggregation circuit 110 can be configured such that the output at a common output node 114 is a recombined RF signal that includes two separated frequency bands associated with the first and second RF signals.

In FIG. 3, the recombined RF signal is shown to be provided to an LNA 120 to amplify and thereby generate a low-noise amplified output signal at an output node 114. The LNA 120 can be configured to operate with a sufficiently wide bandwidth to effectively amplify the first and second bands of the recombined RF signal.

In some embodiments, the pass-band filters 122, 124 can be implemented in a number of ways, including, for example, as surface acoustic wave (SAW) filters. It will be understood that other types of filters can be utilized.

In the example of FIG. 3, the carrier aggregation circuit 110 is shown to include a phase circuit generally indicated as 150, and a switch circuit generally indicated as 140. The first filtered RF signal from the band-pass filter 122 is shown to be passed through a first phase shifting circuit 152.

Similarly, the second filtered RF signal from the band-pass filter 124 is shown to be passed through a second phase shifting circuit 154.

The first and second RF signals from their respective phase shifting circuits (152, 154) are shown to be combined at the common node 126. In some embodiments, a switch S1 can be implemented between the first phase shifting circuit 152 and the common node 126, and a switch S2 can be implemented between the second phase shifting circuit 154 and the common node 126. Such switches can allow the carrier aggregation circuit 110 to operate in a non-carrier aggregation mode or a carrier aggregation mode.

For example, in FIG. 3, the first switch S1 can be closed and the second switch S2 can be open, such that the carrier aggregation circuit 110 processes the first RF signal in the corresponding frequency band in a non-carrier aggregation mode. To process the second RF signal in the other frequency band in a non-carrier aggregation mode, the first switch S1 can be opened and the second switch S2 can be closed.

In another example, both of the first and second switches can be closed, such that the carrier aggregation circuit 110 processes both of the first and second RF signals in their respective frequency bands in a carrier aggregation mode.

In FIG. 3, the common node 126 is shown to be coupled to an input of the LNA 120 to allow the processed RF signal (either a combined RF signal in a carrier aggregation mode or a single-band RF signal in a non-carrier aggregation mode) to be processed by the LNA 120. The LNA 120 is shown to generate an amplified RF signal as an output (RF_OUT) at node 114.

In the example of FIG. 3, the switch circuit 140 can allow the carrier aggregation circuit 110 to operate in either the non-carrier aggregation mode or the carrier aggregation mode. In embodiments where the carrier aggregation circuit 110 is configured to operate in carrier aggregation mode only, the switch circuit 140 may be omitted.

FIG. 3 shows that in some embodiments, the tuner 111 of FIG. 2 can be implemented as a tuning circuit 111 coupled to the common node 126 before the LNA 120. It will be understood that in some embodiments, a tuning circuit having one or more features as described herein can also be implemented at other locations of the carrier aggregation configuration 100.

Figure 4:
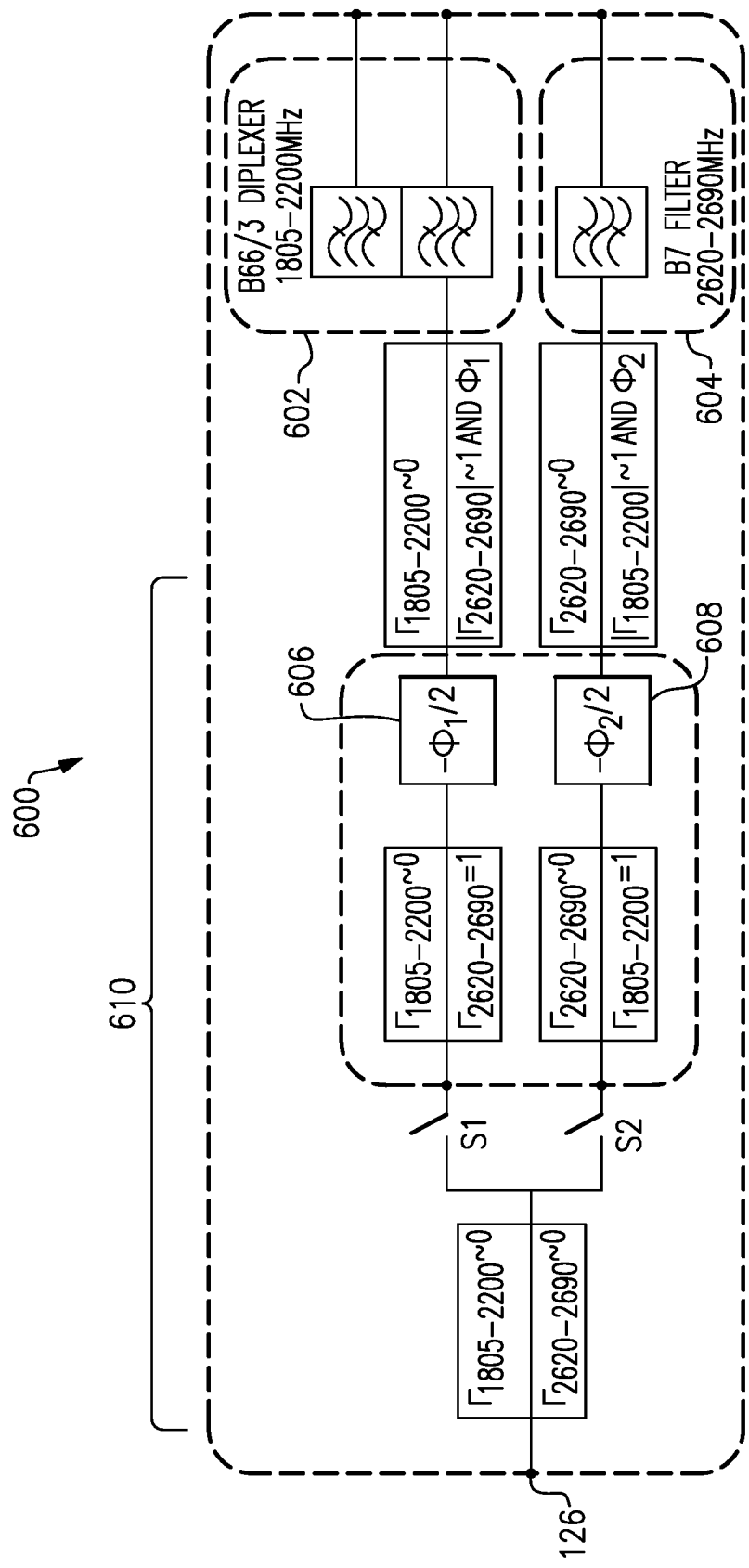
FIG. 4 shows a carrier aggregation configuration that is similar to the carrier aggregation configuration of FIG. 3, but without a tuning circuit.

FIG. 4 shows a carrier aggregation configuration 600 that is similar to the carrier aggregation configuration 100 of FIG. 3, but where the carrier aggregation configuration 600 (of FIG. 4) does not include a tuning circuit. In the example of FIG. 4, the carrier aggregation configuration 600 is shown to include a carrier aggregation circuit 610, and such a carrier aggregation circuit can be configured to receive a plurality of inputs and provide an output to a common node 126. The plurality of inputs can include a first RF signal and a second RF signal. The first RF signal can be provided to the carrier aggregation circuit 610 from a first assembly 602 of band-pass filter(s) (e.g., a diplexer). Similarly, the second RF signal can be provided to the carrier aggregation circuit 610 from a second assembly 604 of band-pass filter(s) (e.g., a single band-pass filter).

In the example of FIG. 4, the carrier aggregation circuit 610 is shown to include a phase circuit having first and second phase shifting circuits 606, 608, and a switch circuit having switches S1, S2. The first filtered RF signal from the diplexer 602 is shown to be passed through the phase shifting circuit 606, and the second filtered RF signal from the band-pass filter 604 is shown to be passed through the phase shifting circuit 608. The first and second RF signals from their respective phase shifting circuits (606, 608) are shown to be routed through the respective switches S1, S2 and be combined at the common node 126. In the example of FIG. 4, the switches S1, S2 can be operated to allow the carrier aggregation circuit 610 to operate in a non-carrier aggregation mode or a carrier aggregation mode, similar to the example of FIG. 3.

In the example of FIG. 4, the diplexer 602 is shown to be configured to support example frequency bands associated with B66 and B3 bands, and the band-pass filter 604 is shown to be configured to support an example frequency band associated with B7 band. It will be understood that while various examples are described in the context of such example bands, one or more features of the present disclosure can also be utilized with other frequency bands.

Referring to FIG. 4, it is noted that inserting a phase shifter along a signal path can rotate an out-of-band reflection coefficient ($\Gamma_{out-of-band}$) from a value less than 1 to a value of approximately 1, such that an out-of-band signal is presented with a large or infinite impedance. The phase shifter along the signal path can also provide an in-band reflection coefficient ($\Gamma_{in-band}$) with a value of approximately 0, such that an in-band signal is presented with an approximately matched impedance. Additional details related to such phase shifter functionalities can be found in U.S. Pat. No. 10,218,390 titled CIRCUITS AND METHODS RELATED TO RADIO-FREQUENCY RECEIVERS HAVING CARRIER AGGREGATION, which is expressly incorporated by reference in its entirety, and its disclosure is to be considered part of the specification of the present application.

In the example of FIG. 4, the amount of phase rotation provided by each phase shifting circuit (606 or 608) can be positive or negative, and can be equal to, for example, $-\phi/2$ for a positive phase shift or $-\Pi-\phi/2$ for a negative phase shift. The former phase rotation ($-\phi/2$) can be utilized to provide a high pass filter functionality, and the latter phase rotation ($-\Pi-\phi/2$) can be utilized to provide a low pass filter functionality.

In some embodiments, phase shifting circuits having the foregoing features are typically easy to optimize and easy to implement with SMT devices or elements. Such phase shifting circuits also provide fairly low loss for signals.

However, in the example of FIG. 4, the phase shifting circuits are not tunable. Since phase of a signal passing through a filter typically varies with frequency, if a given phase shifting circuit is configured to provide an ideal open condition with an infinite impedance for one portion of a relatively wide frequency range, the same phase shifting circuit typically does not provide a similar ideal open condition for another portion of the wide frequency range.

In FIG. 4, the example diplexer 602 is depicted as being configured to support diplexing of B66 band (2110-2200 MHz for downlink) and B3 band (1805-1880 MHz for downlink). Each of B66 and B3 is a mid-band (MB) band, where MB is typically considered to have a frequency range of 1695-2200 MHz. The example filter 604 is depicted as being configured to support B7 band (2620-2690 MHz for downlink) which is a high-band (HB), where HB is typically considered to have a frequency range of 2300-2690 MHz.

Referring to the example of FIG. 4, suppose that the phase shifting circuit 606 is expected to provide an out-of-band reflection coefficient ($\Gamma_{out-of-band}$) value that is 1 or close to 1 for the entirety of the HB frequency range (2300-2690 MHz) that including the B7 band range (2620-2690 MHz). If the phase shifting circuit 606 is configured to provide an out-of-band reflection coefficient (rout-of-band) value of approximately 1 for the B7 band, such an ideal open condition is typically not realized for another HB band such as B40a band (2300-2370 MHz).

To accommodate an acceptable level of an open condition in an MB band (e.g., B66/B3) path for each of a plurality of bands in the HB range, a phase shifting circuit (e.g., 606 in FIG. 4) for the MB band path can be configured to spread the out-of-band reflection coefficient ($\Gamma_{out-of-band}$) approximately evenly within the HB frequency range (e.g., 2300-2690 MHz), to balance the loading loss. An example plot of such a loading loss is shown in FIG. 5C for the HB frequency range. In the context of the example HB bands B40a and B7, such a phase shifting circuit (e.g., 606 in FIG. 4) for the MB can provide a balanced tradeoff between the two HB bands.

Figure 5B:
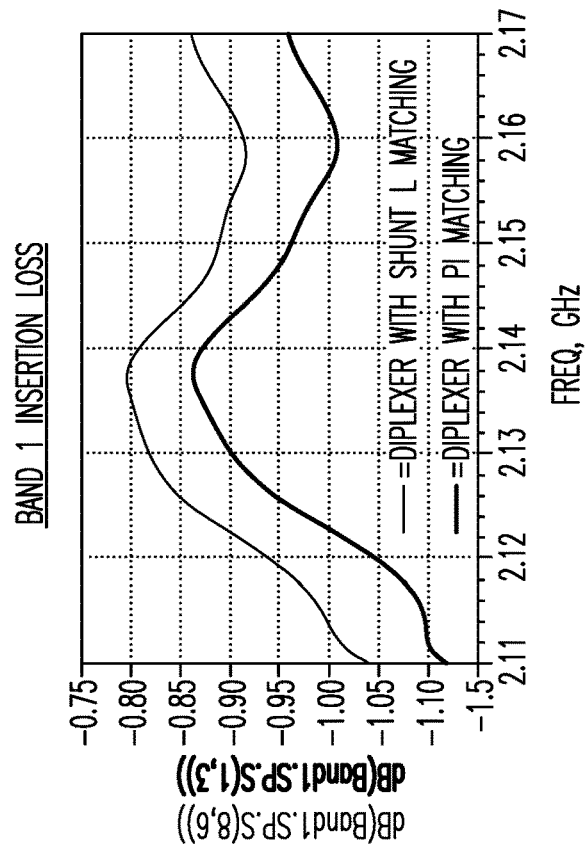
FIGS. 5A to 5D show various performance plots associated with the carrier aggregation configuration of FIG. 4.
Figure 5A:
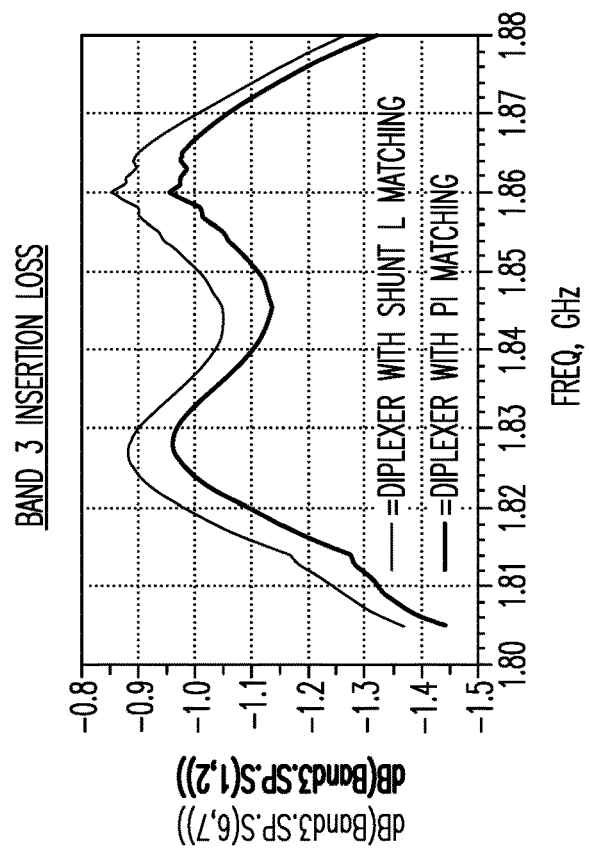
Figure 5C:
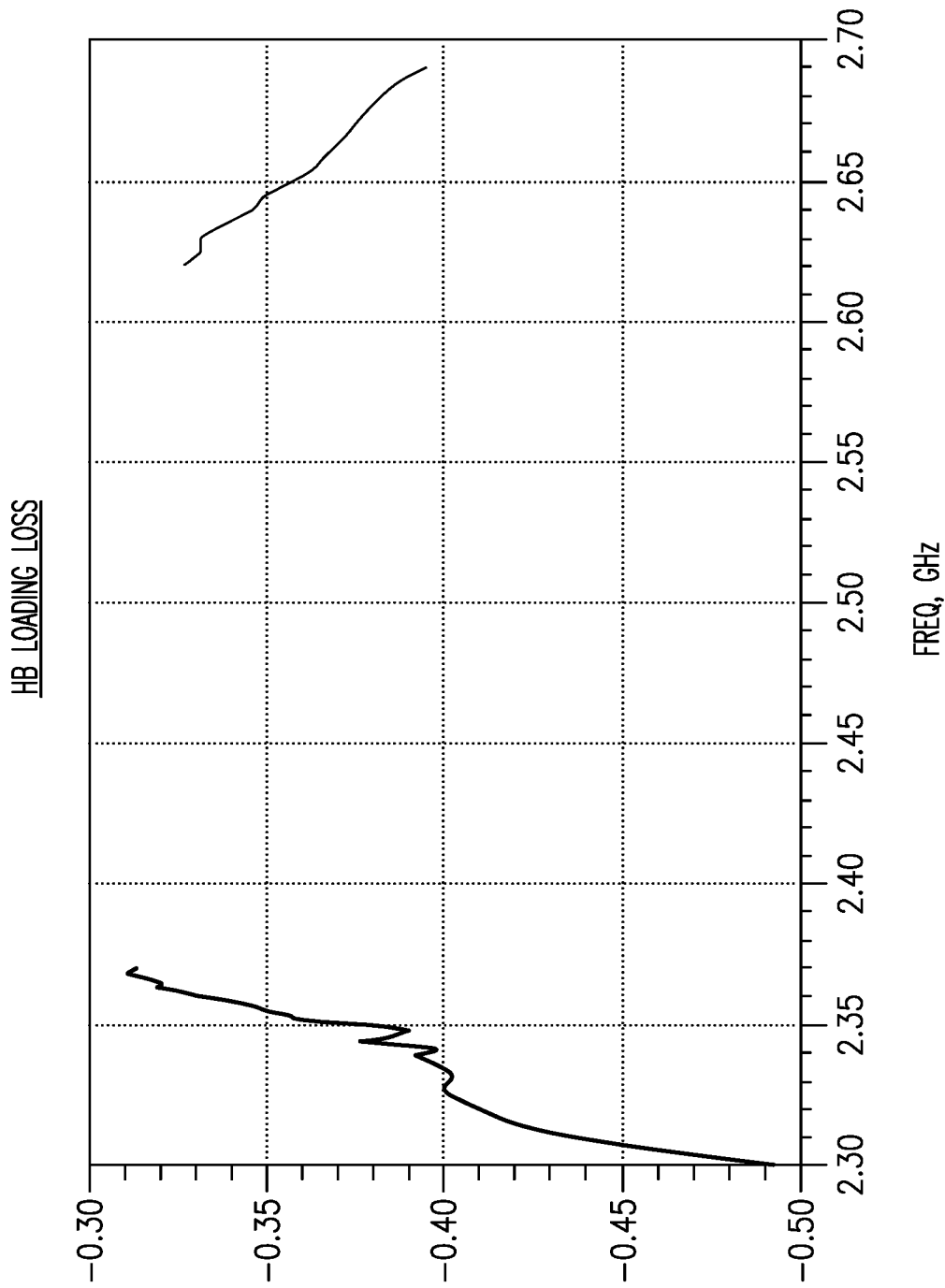

FIGS. 5A to 5D show various performance plots associated with the carrier aggregation configuration 600 of FIG. 4 when the phase shifting circuit 606 is configured in the foregoing balanced manner. More particularly, FIG. 5A shows insertion loss plots across the B3 band (1805-1880 MHz). The upper plot is for a configuration where the diplexer 602 has a shunt inductive matching, and the lower plot is for a configuration where the diplexer 602 has a pi matching. FIG. 5B shows insertion loss plots across the B1 band (2110-2170 MHz) which is similar to the B66 band (2110-2200 MHz). The upper plot is for a configuration where the diplexer 602 has a shunt inductive matching, and the lower plot is for a configuration where the diplexer 602 has a pi matching.

Figure 5D:
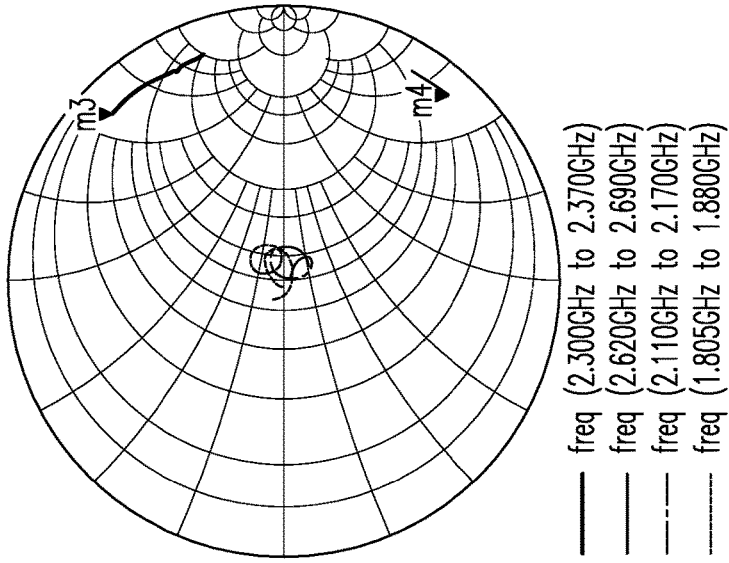
Figure 5D:
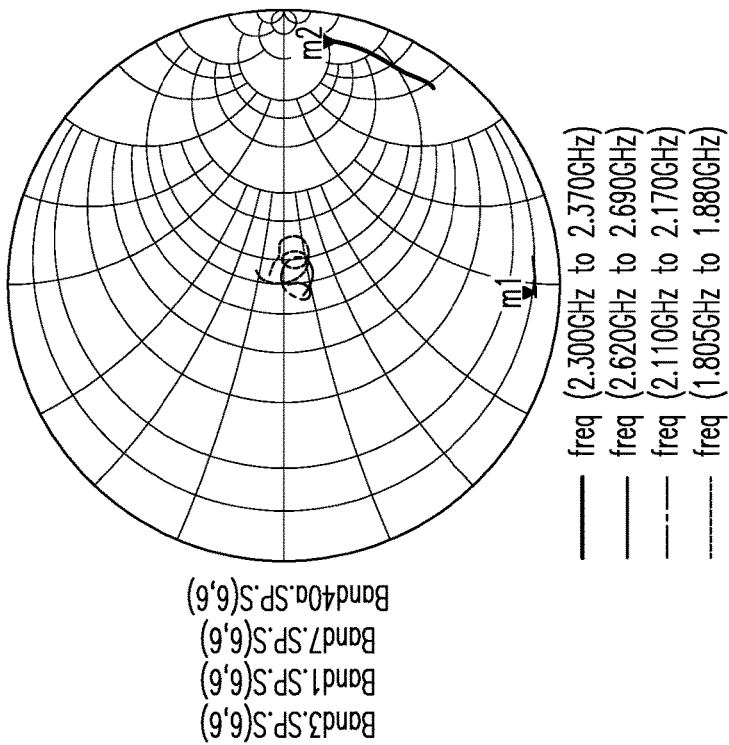

FIG. 5C shows a loading loss plot across the HB frequency range (2300-2690 MHz). FIG. 5D shows impedance plots in a Smith chart format for the bands B40a, B7, B1 and B3 swept through their respective frequency ranges. The left Smith chart is for a configuration where the diplexer 602 has a shunt inductive matching, and the right Smith chart is for a configuration where the diplexer 602 has a pi matching.

Referring to FIG. 5D, it is noted that each of the two MB bands B1 and B3 generally remain at or near the matched impedance states, while the two HB bands B40a (2300-2370 MHz) and B7 (2620-2690 MHz) are at varying reactance values near the zero-resistance (R=0) circle, relative to the ideal open circuit state of $Z=R+jX=\infty$ at the right end of the middle horizontal line. More particularly, in the left Smith chart (diplexer with shunt inductive matching), the B40a band including the impedance value m2 is closer to the ideal open circuit condition, while the B7 band including the impedance value m1 is significantly rotated away from the ideal open circuit. In the right Smith chart (diplexer with pi matching), the B40a band including the impedance value m3 and the B7 band including the impedance value m1 are at approximately opposing reactance values from the ideal open circuit condition.

Figure 6B:
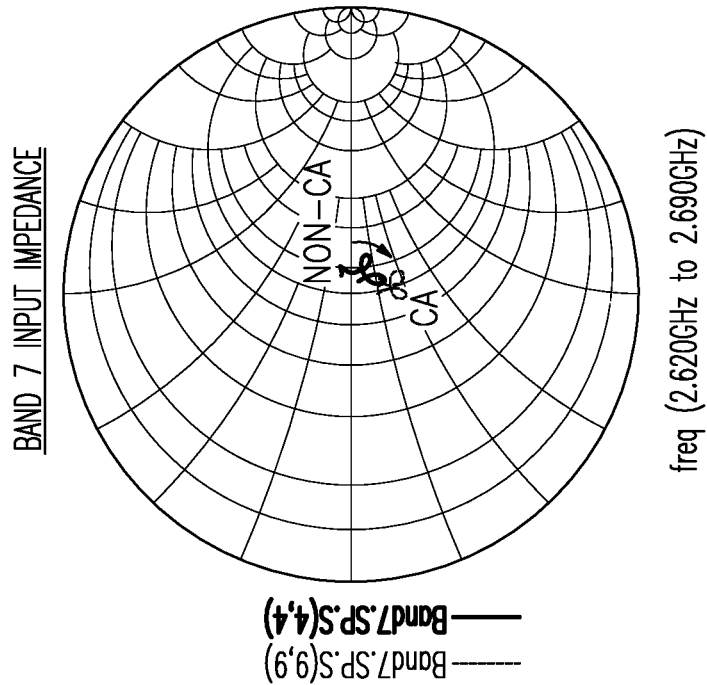
FIGS. 6A and 6B show impedance plots for two example high-band (HB) bands B40a and B7 along their respective paths during non-carrier aggregation and carrier aggregation operations.
Figure 6A:
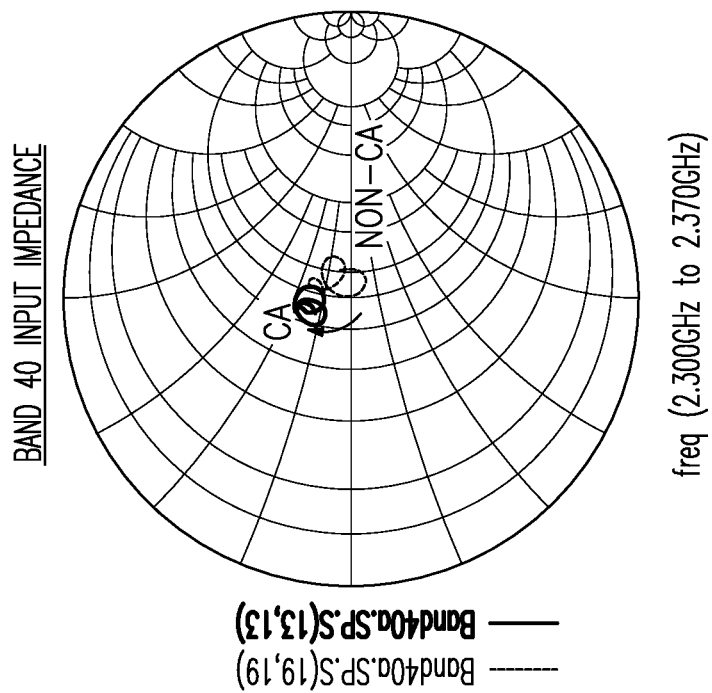

FIGS. 6A and 6B show impedance plots for the two example HB bands B40a and B7 along their respective paths during non-carrier aggregation (Non-CA) and carrier aggregation (CA) operations. The left Smith chart is for the B40a band (not shown in FIG. 4), and the right Smith chart is for the B7 band (including the filter 504 in FIG. 4). For both of the bands B40a and B7, impedance along the respective path generally remains at or close to the matched impedance state during the non-carrier aggregation operation. For the carrier aggregation operation where the B3/B66 path (including the diplexer 602 in FIG. 4) is introduced, one can see that the B40a impedance undergoes a positive reactance shift, and the B7 impedance undergoes a negative reactance shift. Thus, the B3/B66 path provides an inductive response for the B40a band, and a capacitive response for the B7 band.

Referring to the example carrier aggregation configuration 600 of FIG. 4, it is noted that to minimize or reduce the foregoing impedance variation for each of the two example HB bands (B40a and B7), performance tuning strategy is limited to minimize or reduce the filter phase variation of the reflection coefficient for the B3/B66 path be as small as possible across the HB frequency range (2300-2690 MHz).

Figure 7A:
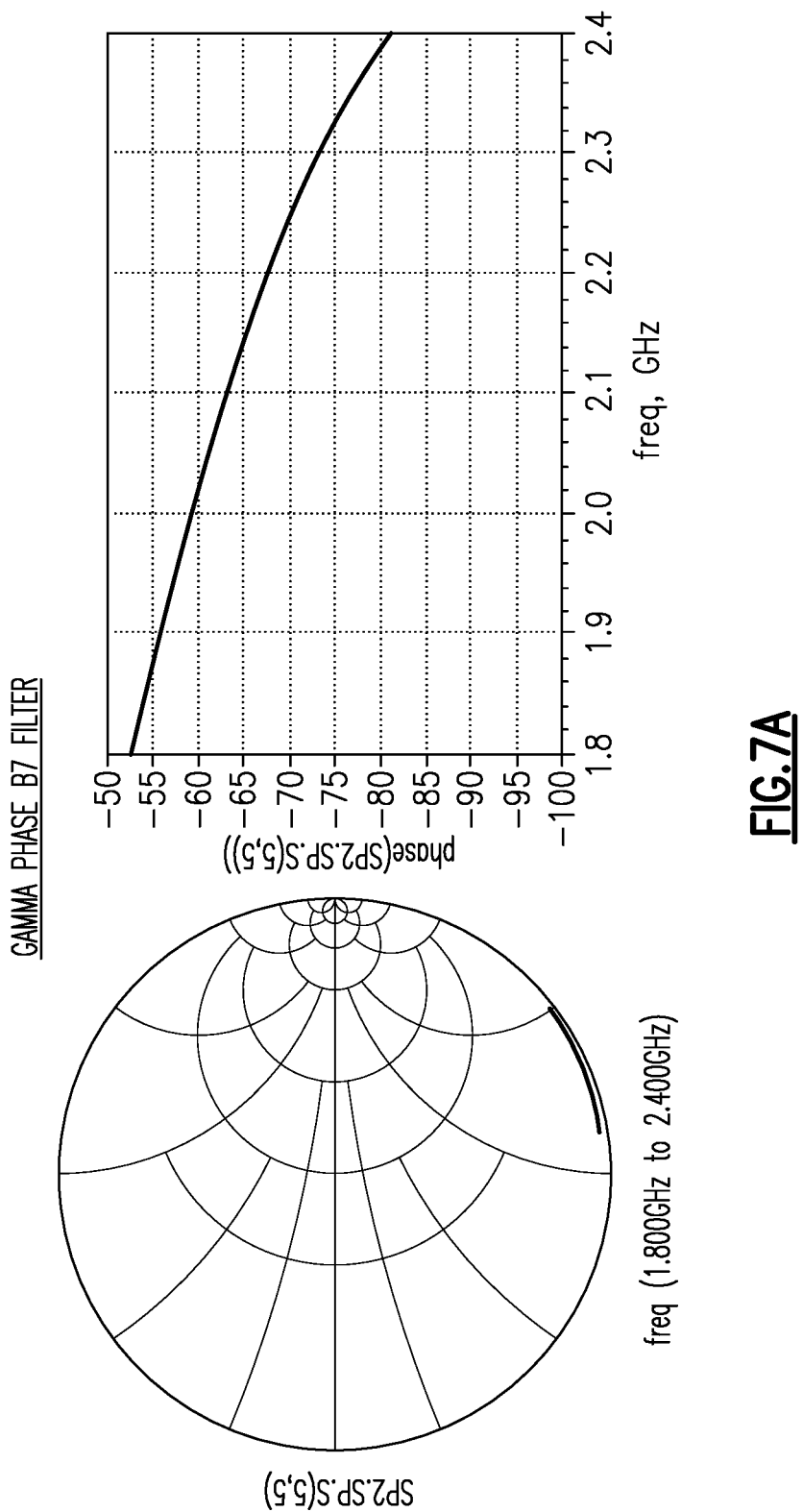
FIGS. 7A to 7C show plots of phase variations of respective reflection coefficients associated with the example filters of the carrier aggregation configuration of FIG. 4.
Figure 7B:
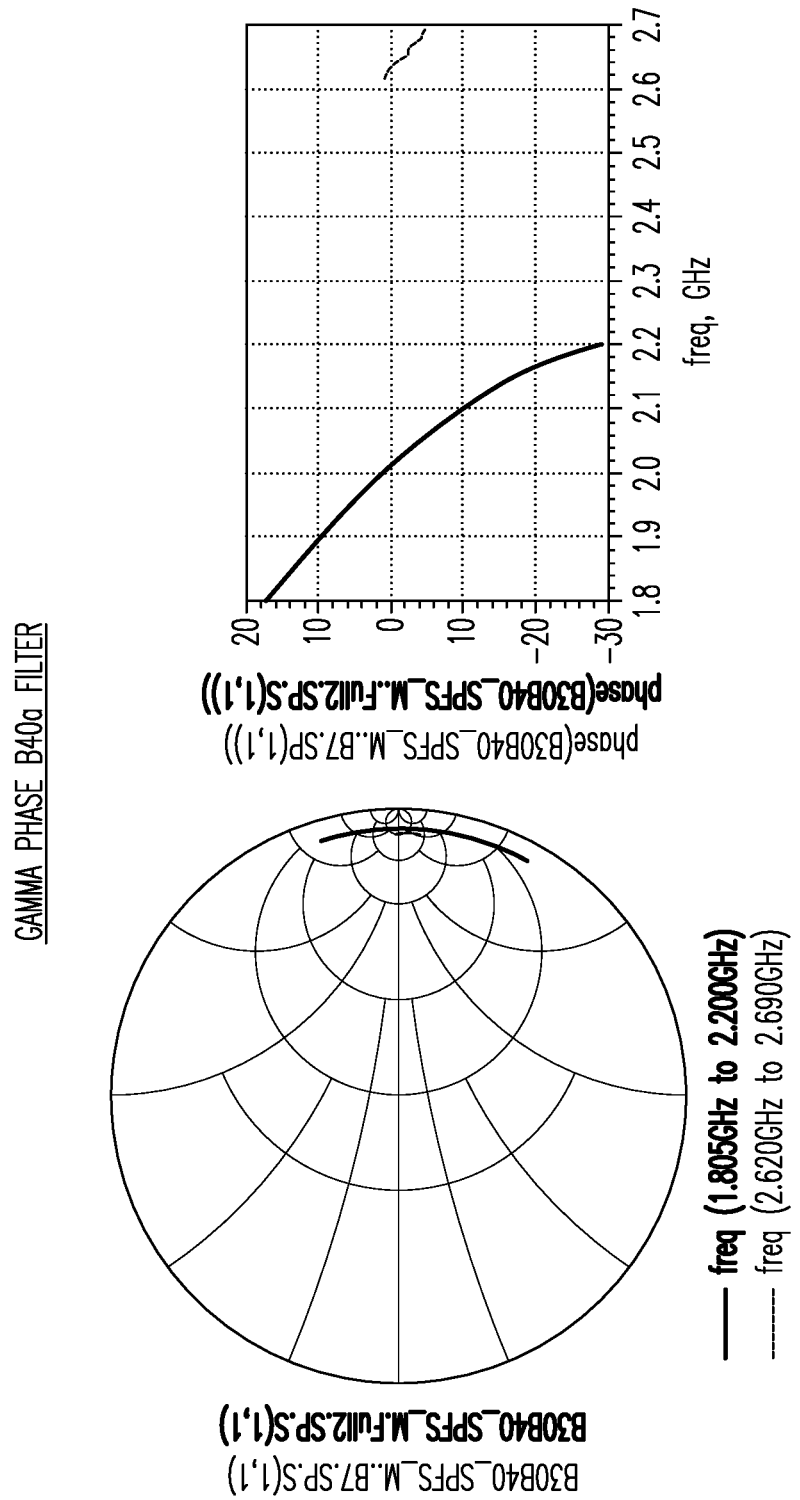
Figure 7C:
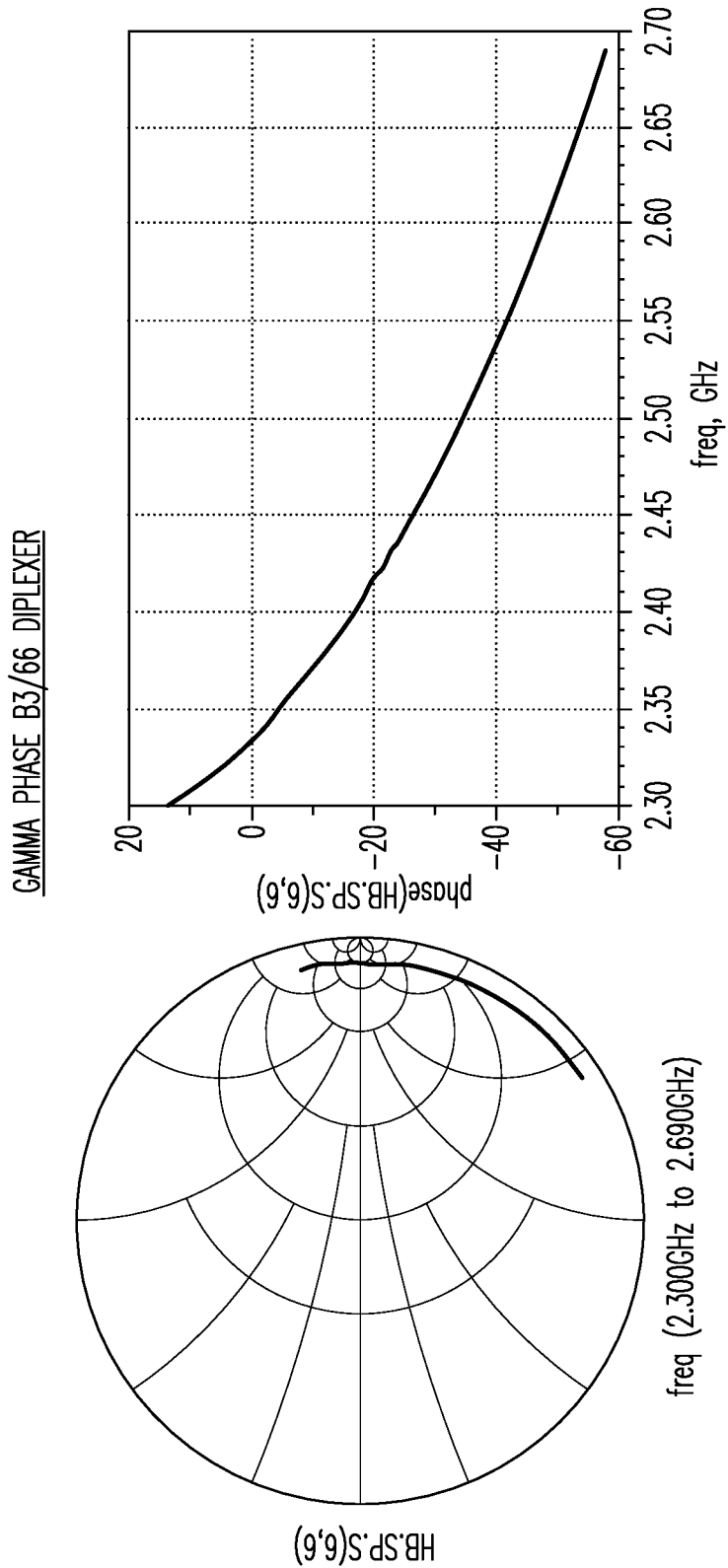

FIGS. 7A to 7C show plots of phase variations of respective reflection coefficients associated with the example filters of the carrier aggregation configuration 600 of FIG. 4. For the purpose of description of FIG. 7A to 7C, phase of reflection coefficient provided by a filter is referred to as gamma (E) phase.

FIG. 7A shows a gamma phase plot for the B7 filter (an HB filter) across a frequency range of 1800-2400 MHz which includes the B3 and B66 ranges. Across such a frequency range of 1800-2400 MHz, the B7 gamma phase is shown to vary by approximately 28 degrees.

FIG. 7B shows a gamma phase plot for the B40a filter (an HB filter) across a frequency range of 1800-2200 MHz which includes the B3 and B66 ranges. Across such a frequency range of 1800-2200 MHz, the B40a gamma phase is shown to vary by approximately 46 degrees.

FIG. 7C shows a gamma phase plot for the B3/B66 diplexer (each band being an MB band) across the HB range (2300-2690 MHz). Across such an HB range, the B3/B66 gamma phase is shown to vary by approximately 70 degrees. Across the B40a range (2300-2370 MHz), the B3/B66 gamma phase is shown to vary by about 23 degrees. Across the B7 range (2620-2690 MHz), the B3/B66 gamma phase is shown to vary by about 8 degrees.

Based on the foregoing observations, it is noted that the gamma phase variation for the B3/B66 diplexer across the entire HB range (70 degrees) is significantly larger that the gamma phase variation for either of the B7 filter across the range of 1800-2400 MHz (28 degrees) and the B40a filter across the range of 1800-2200 MHz (46 degrees). Across each of the B40a and B7 bands (which are sub-bands of the HB range), the gamma phase variation for the B3/B66 diplexer is much smaller than the 70 degree variation across the entire HB range, with the gamma phase variation for the B3/B66 diplexer being the smallest (about 8 degrees) across the B7 band.

It is also noted that the gamma phase variation of 28 degrees for the B7 filter is smaller than the gamma phase variation of 46 degrees for the B40a filter, over a similar frequency range. More particularly, across a frequency range of 1800-2200 MHz, the gamma phase variation for the B7 filter is even less than 28 degrees, at about 15 degrees.

Figure 8:
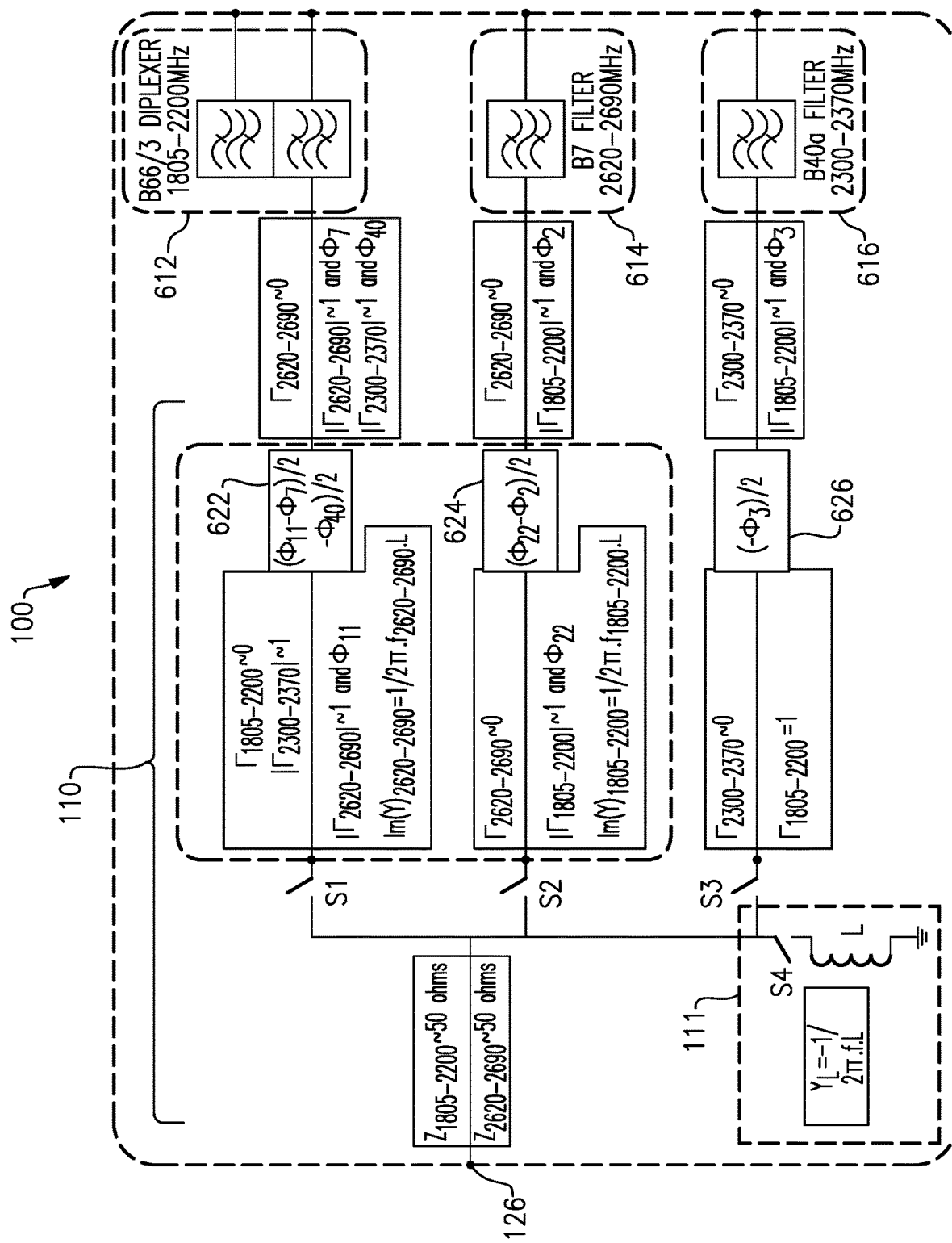
FIG. 8 shows that in some embodiments, a carrier aggregation circuit can include a tuning circuit.

FIG. 8 shows an example carrier aggregation configuration 100 that can address some or all of the features and issues described herein in reference to FIGS. 4 to 7. In the example of FIG. 8, the carrier aggregation configuration 100 is shown to include a carrier aggregation circuit 110, and such a carrier aggregation circuit can be configured to receive a plurality of inputs and provide an output to a common node 126. A first RF signal can be provided to the carrier aggregation circuit 110 from a first assembly 612 of band-pass filter(s) (e.g., a diplexer). A second RF signal can be provided to the carrier aggregation circuit 110 from a second assembly 614 of band-pass filter(s) (e.g., a single band-pass filter). A third RF signal can be provided to the carrier aggregation circuit 110 from a third assembly 664 of band-pass filter(s) (e.g., a single band-pass filter).

In the example of FIG. 8, the carrier aggregation circuit 110 is shown to include a phase circuit having first, second and third phase shifting circuits 622, 624, 626, and a switch circuit having switches S1, S2, S3. The first filtered RF signal from the diplexer 612 is shown to be passed through the phase shifting circuit 622, the second filtered RF signal from the band-pass filter 614 is shown to be passed through the phase shifting circuit 624, and the third filtered RF signal from the band-pass filter 616 is shown to be passed through the phase shifting circuit 626. The first, second and third RF signals from their respective phase shifting circuits (622, 624, 626) are shown to be routed through the respective switches S1, S2, S3 and be combined at the common node 126. In the example of FIG. 8, the switches S1, S2, S3 can be operated to allow the carrier aggregation circuit 110 to operate in a non-carrier aggregation mode or a carrier aggregation mode.

In the example of FIG. 8, the diplexer 612 is shown to be configured to support example frequency bands associated with B66 and B3 bands, the band-pass filter 614 is shown to be configured to support an example frequency band associated with B7 band, and the band-pass filter 616 is shown to be configured to support an example frequency band associated with B40a band. It will be understood that while various example are described in the context of such example bands, one or more features of the present disclosure can also be utilized with other frequency bands.

Referring to FIG. 8, it is noted that inserting a phase shifter along a signal path can rotate an out-of-band reflection coefficient ($\Gamma_{out\text{-}of\text{-}band}$) from a value less than 1 to a value of approximately 1, such that an out-of-band signal is presented with a large or infinite impedance. The phase shifter along the signal path can also provide an in-band reflection coefficient ($\Gamma_{in\text{-}band}$) with a value of approximately 0, such that an in-band signal is presented with an approximately matched impedance. Additional details related to such phase shifter functionalities can be found in the above-referenced U.S. Pat. No. 10,218,390.

As described herein, the HB frequency range (2300-2690 MHz) can include a plurality of bands such as B40a (2300-2370 MHz) and B7 (2620-2690 MHz) bands. Similarly, the MB frequency range (1695-2200 MHz) can include a plurality of bands such as B3 (1805-1880 MHz) and B66 (2110-2200 MHz) bands. In the various examples described herein, the two HB bands B40a and B7 are supported by respective filters 616, 614; and the two MB bands B3 and B66 are supported by respective filters implemented as a diplexer. It will be understood that one or more features of the present disclosure can also be implemented utilizing other combinations of filters.

As also described herein, out-of-band impedance provided by a typical B3/B66 filter assembly (e.g., a diplexer), such as the diplexer 602 of FIG. 4, does not provide an ideal open circuit condition across the entirety of the HB frequency range (2300-2690 MHz).

In some embodiments, and referring to the example of FIG. 8, for a group of one or more MB bands (e.g., B3 and B66), an assembly of one or more MB filters (e.g., B3/B66 diplexer) can be provided, and a complementary HB filter for a sub-band of the HB frequency range (2300-2690 MHz) can be implemented so that its out-of-band impedance has a phase which produces an equivalent impedance phase shift on B3/B66. For example, the complementary HB filter can be a B7 filter, such that if B3/B66 impedance at B7 is capacitive, B7 impedance at B3/B66 is capacitive as well. In another example, if B3/B66 impedance at B7 is inductive, B7 impedance at B3/B66 is inductive as well.

In some embodiments, the carrier aggregation circuit 110 of FIG. 8 can include a tuning circuit 111 coupled to the common node 126. Such a tuning circuit can be configured to tune out the imaginary part of the foregoing out-of-band impedance associated with the complementary MB (B3/B66) and HB (B7) filters. For example, in the example context of the B3/B66 impedance at B7 being capacitive and the B7 impedance at B3/B66 being capacitive as well, the negative imaginary part (capacitive response) of the impedance can be tuned out partially or fully by an inductive response of the tuning circuit. In some embodiments, such an inductive response can be provided by an inductor, having an inductance value of L, that couples the common node 126 to ground. Examples of how the inductance value L can be selected are described herein in greater detail.

In the example of FIG. 8, the inductor L of the tuning circuit 111 can be introduced to the common node 126 in a switchable manner by a switch S4 in series with the inductor L. Such a switchable functionality of the tuning circuit 111 can be utilized to, for example, connect the inductor L to the common node 126 during a carrier aggregation operation and disconnect the inductor L from the common node 126 during a non-carrier aggregation operation.

In some embodiments, and referring to the example of FIG. 8, the phase shifting circuit 622 associated with the MB (B3/B66) diplexer 612 can be configured to provide an optimized gamma phase for one of the plurality of HB bands (B7, B40a). In some embodiments, such an HB band for which the phase shifting circuit 622 is optimized can be the one having the largest gamma phase variation across a frequency range that includes the MB bands (e.g., 1805-2200 MHz to cover the B3 and B66 bands). As described in reference to FIGS. 7A to 7C, and in the context of the example bands B3, B66, B7 and B40a, the gamma phase variation across 1805-2200 MHz is much less for the B7 filter than the B40 filter. Accordingly, the B3/66 phase shifting circuit 622 can be configured to provide an optimized gamma phase in the B40a band (2300-2370 MHz).

With the foregoing configuration of the B3/66 phase shifting circuit 622, the gamma phase of B3/B66 at B7 (2620-2690 MHz) ($\phi_H$) is consequently strongly negative, and the corresponding admittance (Y=G+jB, with G being conductance and B being susceptance) is approximately $jB_H$. In some embodiments, the gamma phase of B7 at B3/B66 (e.g., 1805-2200 MHz) can be adjusted from an ideal open target to a phase ($\phi_M$) that corresponds to an admittance of approximately $jB_M$. In some embodiments, the foregoing HB and MB susceptance values $B_H$ and $B_M$, respectively, can be obtained by Equations 1A and 1B.

$$B_H = -\frac{1}{2\pi f_H L}, \quad (1A)$$

$$B_M = -\frac{1}{2\pi f_M L}. \quad (1B)$$

Referring to the outputs of the phase shifting circuits 622, 624, 626 of FIG. 8, it is noted that the reflection coefficient of B3/B66 at the output of the B44a phase shifting circuit 626 is at or close to 1, since the B3/B66 diplexer 612 is optimized for the B40a band as described above. Also as described above, and referring to Equations 1A and 1B, the HB and MB susceptance values $B_H$ and $B_M$ are depicted as $B_H$=Im(Y)$_{2620\text{-}2690}$=1/(2$\pi$f$_{2630\text{-}2690}$L), and $B_M$=Im(Y)$_{1805\text{-}2200}$=1/(2$\pi$f$_{1805\text{-}2200}$L) at the outputs of the phase shifting circuits 622 and 624, respectively.

As described herein, the tuning circuit 111 can be configured to tune out the imaginary part of the out-of-band impedance associated with the complementary MB (B3/B66) and HB (B7) filters. In some embodiments, the inductance L value of the inductor of the tuning circuit 111 can be selected to cancel out the imaginary part of the admittance $Y_H$(Im(Y)$_{2620\text{-}2690}$=1/(2$\pi$f$_{2620\text{-}2690}$L). Accordingly, for such a configuration, the admittance of the inductor of the tuning circuit 111 can be $Y_L$, and have a value with an opposing sign as Im(Y)$_{2620\text{-}2690}$. That is, in some embodiments, $Y_L$ can have a value of −1/(2$\pi$f$_{2620\text{-}2690}$L)).

In some embodiments, the value of $Y_L$ can be selected to cancel out Im(Y)$_{2620\text{-}2690}$, Im(Y)$_{1805\text{-}2200}$, or some combination thereof.

In some embodiments, with the value of L selected in the foregoing manner, Equation 1B can be utilized to set values for the reactance ($X_M$) and phase ($\phi_M$) of B7 at B3/B66.

Figure 9:
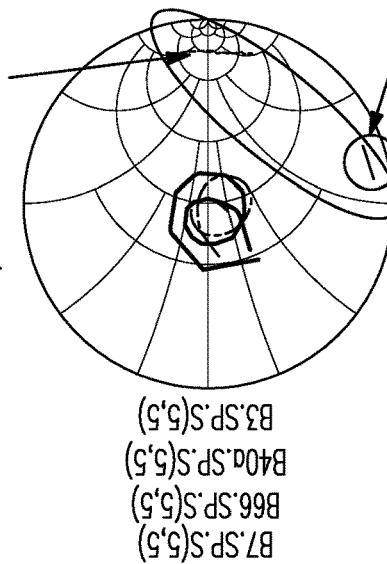
FIG. 9 shows examples of performance comparison between the carrier aggregation configuration of FIG. 4 and the carrier aggregation configuration of FIG. 8.
Figure 9:
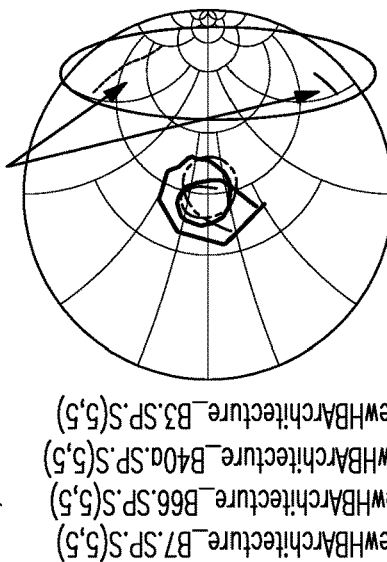
Figure 9:
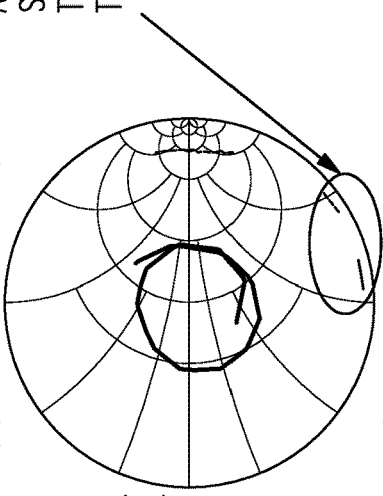

FIG. 9 shows examples of performance comparison between the carrier aggregation configuration 600 of FIG. 4 ("Baseline") and the carrier aggregation configuration 100 of FIG. 8 ("New"). Referring to the upper left Smith chart, one can see that for the Baseline B3/B66 plot, phase is evenly tuned between B40a and B7. For the New B3/B66 plot in the upper right Smith chart, phase is shown to be tuned for the B40a band.

Referring to the lower left Smith chart, one can see that for the Baseline B7 plot, phase is tuned to an approximately open impedance. For the New B7 plot in the lower right Smith chart, phase is shown to be tuned to match the B3/B66 out-of-band impedance.

Referring to the upper right and lower right Smith charts, both impedances are capacitive; and as described herein, a shunt inductor of the tuning circuit 111 of FIG. 8 can be utilized to tune out the imaginary part of the corresponding admittance.

It is noted that in the example results shown in FIG. 9, the phase shifting circuit associated with the B3/B66 path has the gamma phase tuned for the carrier aggregation operation of B40a band in an ideal manner. It is also noted that the B40a filter's gamma phase for the New configuration of FIG. 8 is similar to the B40a filter's gamma phase for the Baseline configuration of FIG. 4. It is also noted that the B7 filter's gamma phase at the MB frequency range is adjusted to provide a similar capacitive impedance.

Figure 10:
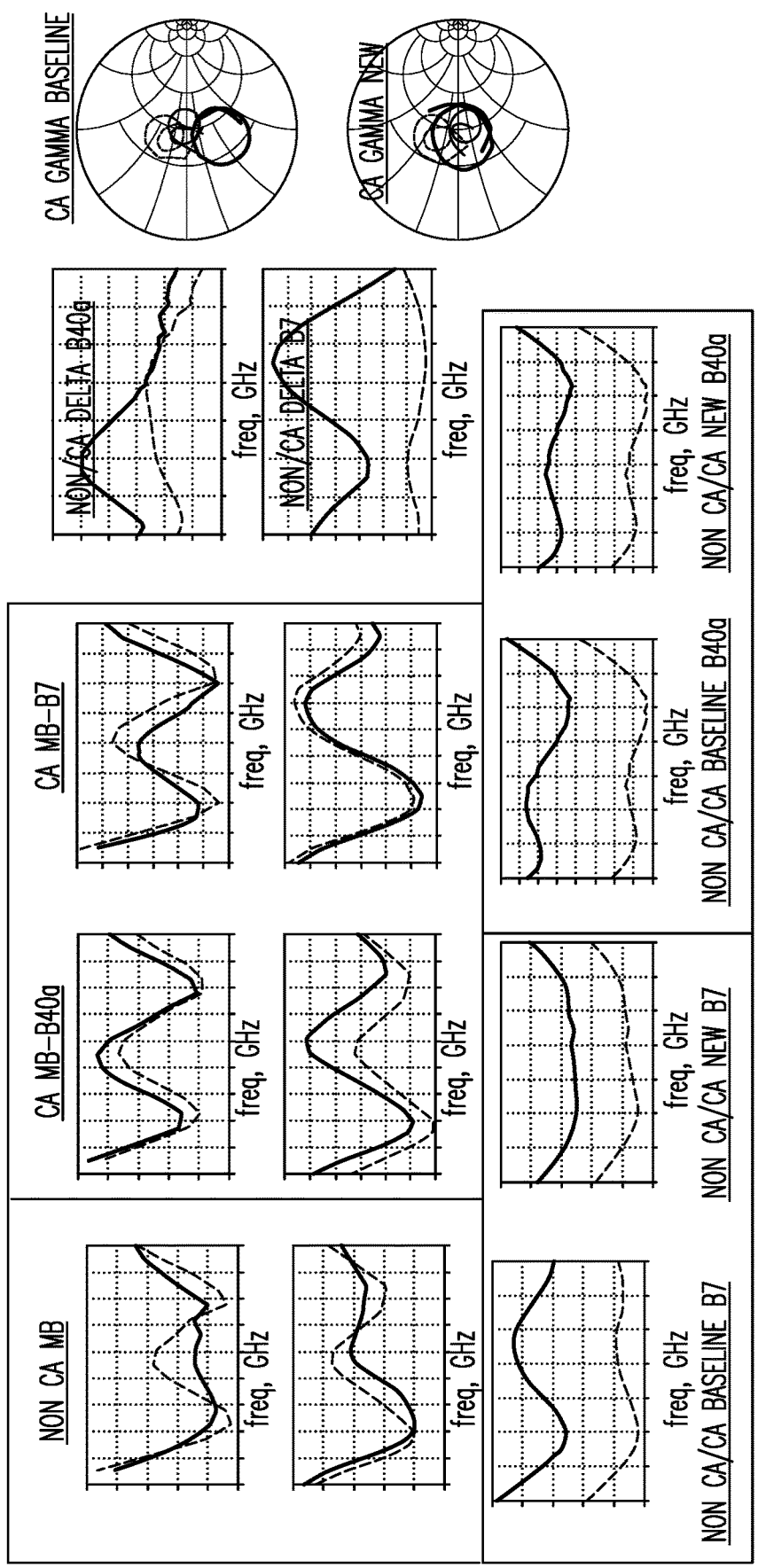
FIG. 10 shows additional examples of performance comparison between the carrier aggregation configuration of FIG. 4 and the carrier aggregation configuration of FIG. 8.

FIG. 10 shows additional comparisons of the Baseline and New configurations as described herein, for both non-carrier aggregation and carrier aggregation operations. Referring to FIG. 10, it is noted that the New configuration provides performance levels in non-carrier aggregation operations that are similar to performance levels for the Baseline configuration. It is also noted that for carrier aggregation operations involving MB signals, the New configuration provides similar performance levels as the Baseline configuration.

Referring to FIG. 10, it is further noted that improved HB carrier aggregation performance is shown to be achieved for the New configuration when compared to the Baseline configuration. For example, noise figure non-carrier aggregation/carrier aggregation delta value of 0.55 dB for the Baseline configuration is reduced to 0.44 dB for the New configuration on B40a, and from 0.68 dB (Baseline) to 0.4 dB on B7. In addition, the carrier aggregation input matching is shown to be greatly improved for B7.

Figure 11:
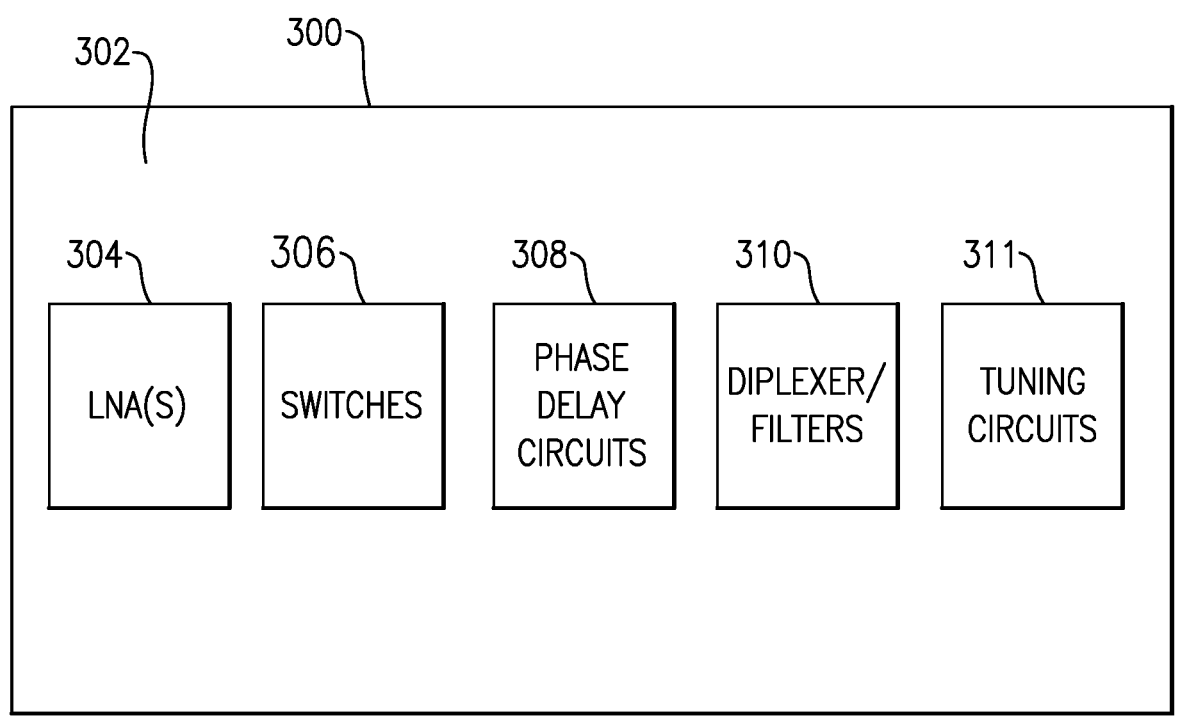
FIG. 11 shows that in some embodiments, one or more features of the present disclosure can be implemented on a module.

In some embodiments, one or more features of the present disclosure can be implemented in a radio-frequency (RF) module. FIG. 11 shows a block diagram of an RF module 300 (e.g., a front-end module) having a packaging substrate 302 such as a laminate substrate. Such a module can include one or more LNAs 304. An LNA implemented on such a die can be configured to receive RF signals through signal paths as described herein. Such an LNA can also benefit from the one or more advantageous features associated with improved carrier aggregation (CA) functionalities as described herein.

The RF module 300 can further include a plurality of switches 306. Such switches can be configured to provide the various switching functionalities as described herein, including providing and/or facilitating isolation, enabling/disabling carrier aggregation mode of operation, and band selection in a non-carrier aggregation mode.

The RF module 300 can further include one or more diplexers and/or a plurality of filters (collectively indicated as 310) configured to process RF signals. Such diplexers/filters can be implemented as surface-mount devices (SMDs), as part of an integrated circuit (IC), of some combination thereof. Such diplexers/filters can include or be based on, for example, SAW filters.

In FIG. 11, a plurality of phase shifting circuits are collectively indicated as 308. Such phase shifting circuits can include one or more features as described herein to provide, among others, improved isolation between paths associated with different bands being operated in a carrier aggregation mode.

The RF module 300 can further include one or more tuning circuits 311 having one or more features as described herein.

Figure 12:
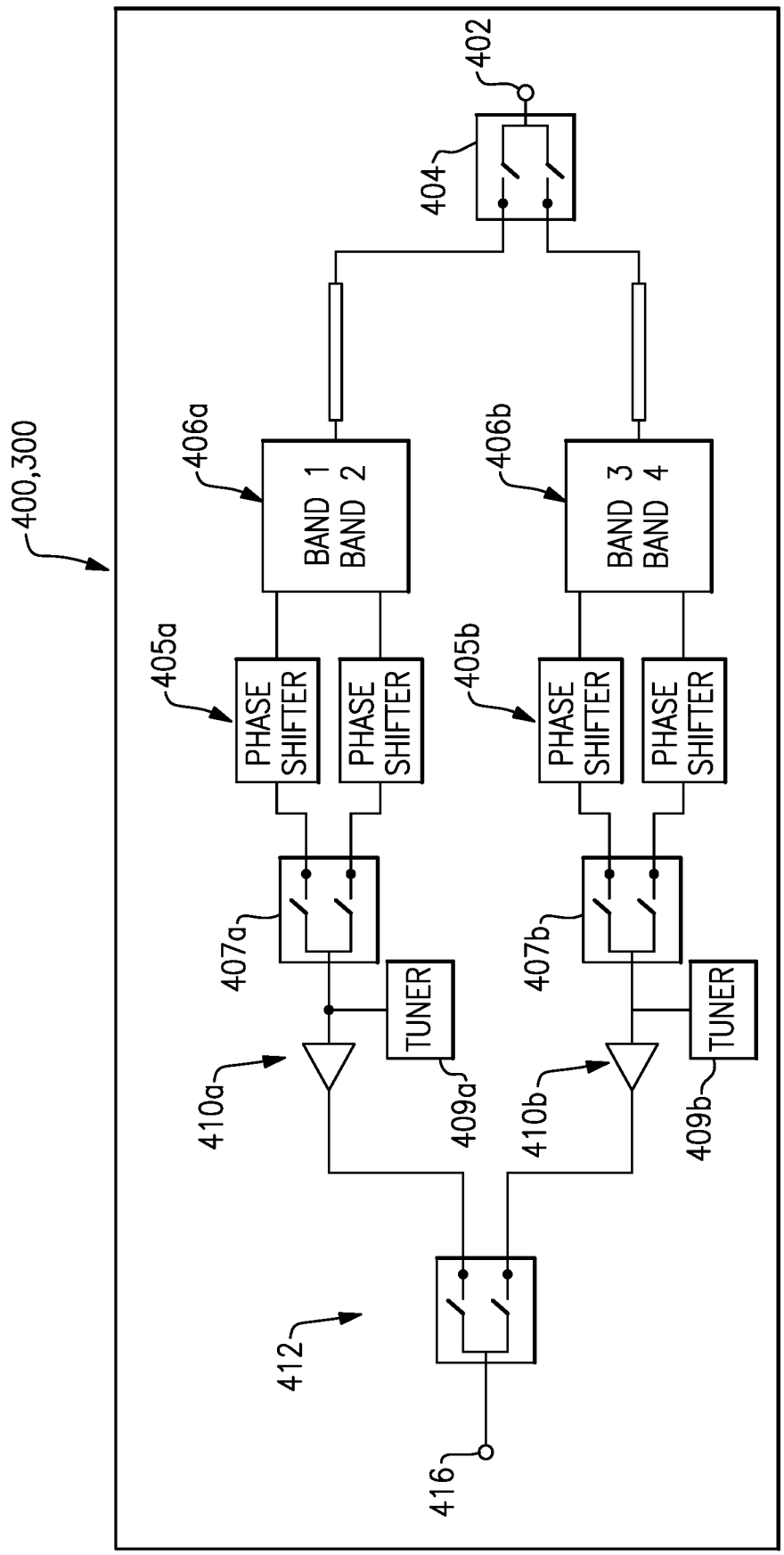
FIG. 12 shows an example of a radio-frequency architecture that includes one or more features as described herein.

FIG. 12 shows an example of an RF architecture 400 that includes one or more features as described herein. In some embodiments, such an architecture can be implemented on a module 300 such as the example described in reference to FIG. 11. It will be understood that the architecture 400 of FIG. 12 does not necessarily need to be confined to a module.

The example architecture 400 of FIG. 12 can include a number of signal paths configured for receiving and/or transmitting RF signals. The architecture 400 can also include an antenna switching circuit 404 coupled to an antenna port 402. Such an antenna switching circuit can be configured to route RF signals in cellular frequency ranges to multiple paths associated with different cellular bands. In the example shown, the antenna switching circuit 404 includes a single-pole-2-throw (SP2T) switch, with the pole being coupled to the antenna port 402.

In the context of the example RX paths, the first path is configured to support at least first and second bands (Band 1 and Band 2), and the second path is configured to support at least third and fourth bands (Band 3 and Band 4). RF signals associated with such bands are shown to be processed by their respective filters 406a, 406b.

Signals in the first and second bands of the first path can be carrier aggregated as described herein and be amplified by an LNA 410a. As described herein, carrier aggregation for the first and second bands can include a plurality of phase shifting circuits 405a implemented between the diplexer 406a and the LNA 410a. As also described herein, the paths between such phase shifting circuits and the LNA 410a can include respective switches 407a to allow operations in carrier aggregation mode as well as non-carrier aggregation mode.

Signals in the third and fourth bands of the second path can be carrier aggregated as described herein and be amplified by an LNA 410b. As described herein, carrier aggregation for the third and fourth bands can include a plurality of phase shifting circuits 405b implemented between the diplexer 406b and the LNA 410b. As also described herein, the paths between such phase shifting circuits and the LNA 410b can include respective switches 407b to allow operations in carrier aggregation mode as well as non-carrier aggregation mode.

In the example of FIG. 12, a tuner 409a having one or more features as described herein is shown to be coupled to a common node between the switches 407a and the LNA 410a. Similarly, a tuner 409b having one or more features as described herein is shown to be coupled to a common node between the switches 407b and the LNA 410b.

In the example of FIG. 12, the amplified signals from the LNA(s) (410a and/or 410b) can be routed to a band selection switch 412. The band selection switch 412 is shown to be coupled to a node 416 to allow further processing of an amplified RF signal from the selected LNA(s).

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 13:
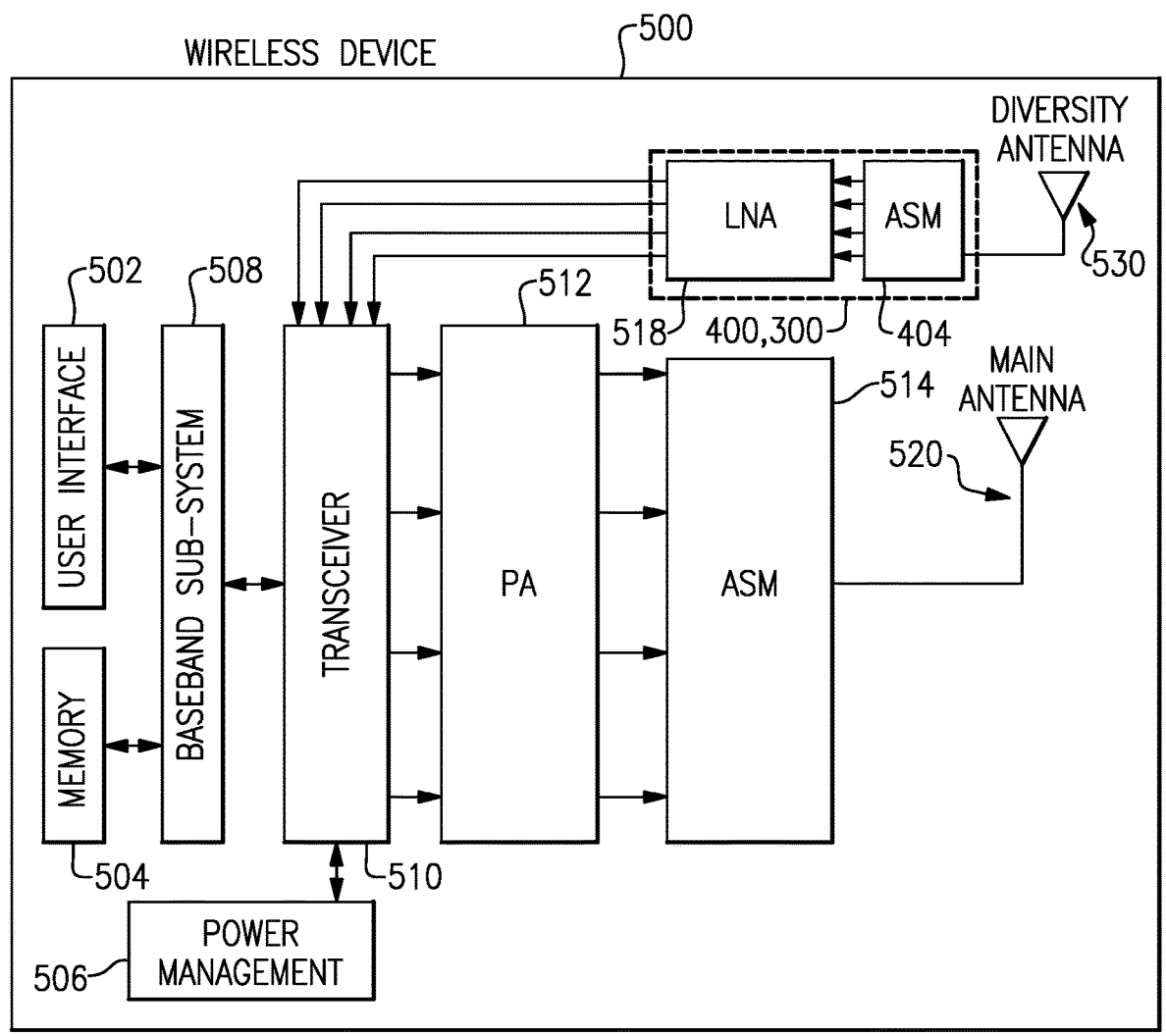
FIG. 13 schematically depicts an example wireless device having one or more advantageous features described herein.

FIG. 13 schematically depicts an example wireless device 500 having one or more advantageous features described herein. In some embodiments, such advantageous features can be implemented in a front-end (FE) module 300 and/or in an architecture 400 as described herein. In some embodiments, one or more of such features can also be implemented in a main antenna switch module (ASM) 514. In some embodiments, such an FEM/architecture can include more or less components than as indicated by the dashed box.

Referring to FIG. 13, power amplifiers (Pas) in a power amplifier module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, the front-end module 300/architecture 400 can include one or more carrier aggregation-capable signal paths configured to provide one or more functionalities as described herein. Such signal paths can be in communication with an antenna switch module (ASM) 404 through their respective diplexer(s). In some embodiments, at least some of the signals received through a diversity antenna 530 can be routed from the ASM 404 to one or more low-noise amplifiers (LNAs) 518 in manners as described herein. Amplified signals from the LNAs 518 are shown to be routed to the transceiver 510.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A carrier aggregation circuit comprising
a first path having an input and an output, and configured to support one or more frequency bands, the first path including a filter assembly and a phase shifting circuit;
a second path and a third path, each of the second and third paths configured to support a respective frequency band and including an input and an output, and a respective filter and a respective phase shifting circuit, a selected one of the filters of the second and third paths and the filter assembly of the first path configured to provide respective impedances having the same sign for respective imaginary parts, the phase shifting circuit of the first path configured to provide a desired reflection coefficient phase at one of the frequency bands of the second and third paths;
a common node coupled to the output of each of the first path, the second path and the third path; and
a tuning circuit implemented to remove or reduce the imaginary part of the impedance of the filter assembly of the first path at the frequency band associated with the selected filter.

2. The carrier aggregation circuit of claim 1 wherein each of the one or more frequency bands of the first path includes a mid-band frequency band, the frequency band of the second path includes a high-band frequency band, and the frequency band of the third path includes a high-band frequency band.

3. The carrier aggregation circuit of claim 2 wherein the one or more mid-band frequency bands includes a first mid-band frequency band and a second mid-band frequency band.

4. The carrier aggregation circuit of claim 3 wherein the first mid-band frequency band includes a B3 band, and the second mid-band frequency band includes a B66 band.

5. The carrier aggregation circuit of claim 3 wherein the mid-band filter assembly includes a mid-band filter for the first mid-band frequency band, and a second mid-band filter for the second mid-band frequency.

6. The carrier aggregation circuit of claim 5 wherein the mid-band filter and the second mid-band filter are implemented as a mid-band diplexer.

7. The carrier aggregation circuit of claim 2 wherein the impedance of each of the selected high-band filter and the mid-band filter assembly has a negative imaginary part to provide a capacitive response.

8. The carrier aggregation circuit of claim 7 wherein the tuning circuit is configured to provide an impedance having a positive imaginary part to remove or reduce the negative imaginary part of the impedance of the mid-band filter assembly at the high-band frequency band associated with the selected high-band filter.

9. The carrier aggregation circuit of claim 8 wherein the tuning circuit includes an inductor that couples the common node to ground to provide an inductive response.

10. The carrier aggregation circuit of claim 2 wherein each of the mid-band, first high-band and second high-band paths includes a switch to allow some or all of the paths to support one or more carrier-aggregation operations, or a non-carrier-aggregation operation through each path.

11. The carrier aggregation circuit of claim 10 wherein the tuning circuit includes a switch to allow the tuning circuit to be coupled to the common node during the one or more carrier-aggregation operations, or to be uncoupled from the common node during a non-carrier-aggregation operation.

12. A method for carrier aggregating signals, the method comprising
supporting a signal in a frequency band through a filter assembly and a phase shifting circuit of a first path;
supporting a signal in a frequency band through a filter and a phase shifting circuit of a second path, and supporting a signal in a frequency band through a filter and a phase shifting circuit of a third path, such that a selected one of the filters of the second and third paths and the filter assembly of the first path provide respective impedances having the same sign for respective imaginary parts, and the phase shifting circuit of the first path provides a desired reflection coefficient phase at one of the frequency bands of the second and third paths;

combining the signals of the the first path, the second path and the third path at a common node; and providing tuning for some or all of the signals to remove or reduce the imaginary part of the impedance of the filter assembly of the first path at the frequency band associated with the selected filter.

13. The method of claim 12 wherein each of the one or more frequency bands of the first path includes a mid-band frequency band, the frequency band of the second path includes a high-band frequency band, and the frequency band of the third path includes a high-band frequency band.

14. The method of claim 13 wherein the mid-band frequency band includes either or both of B3 and B66 bands.

15. The method of claim 13 wherein the impedance of each of the selected high-band filter and the mid-band filter assembly has a negative imaginary part to provide a capacitive response.

16. The method of claim 15 wherein the tuning provides an impedance having a positive imaginary part to remove or reduce the negative imaginary part of the impedance of the mid-band filter assembly at the high-band frequency band associated with the selected high-band filter.

17. The method of claim 16 wherein the tuning includes providing an inductance between the common node ground to provide an inductive response.

18. The method of claim 17 wherein the providing of the inductance includes performing a switching operation to provide or remove the inductance between the common node and the ground.

19. A wireless device comprising:
a receiver configured to process radio-frequency signals;
a carrier-aggregation circuit in communication with the receiver, the carrier-aggregation circuit including a first path having an input and an output, and configured to support one or more frequency bands, the first path including a filter assembly and a phase shifting circuit, the carrier-aggregation circuit further including a second path and a third path, each of the second and third paths configured to support a respective frequency band and including an input and an output, and a respective filter and a respective phase shifting circuit, a selected one of the filters of the second and third paths and the filter assembly of the first path configured to provide respective impedances having the same sign for respective imaginary parts, the phase shifting circuit of the first path configured to provide a desired reflection coefficient phase at one of the frequency bands of the second and third paths, the carrier-aggregation circuit further including a common node coupled to the output of each of the first path, the second path and the third path, the carrier-aggregation circuit further including a tuning circuit implemented to remove or reduce the imaginary part of the impedance of the filter assembly of the first path at the frequency band associated with the selected filter; and
an antenna in communication with the carrier-aggregation circuit, the antenna configured to receive the radio-frequency signals.

20. The wireless device of claim 19 wherein each of the one or more frequency bands of the first path includes a mid-band frequency band, the frequency band of the second path includes a high-band frequency band, and the frequency band of the third path includes a high-band frequency band.

21. The wireless device of claim 19 wherein the one or more mid-band frequency bands, and the first and second high-band frequency bands are cellular frequency bands.

22. The wireless device of claim 21 wherein the one or more mid-band frequency bands includes a first mid-band frequency band and a second mid-band frequency band.

23. The wireless device of claim 22 wherein the mid-band filter assembly includes a mid-band filter for the first mid-band frequency band, and a second mid-band filter for the second mid-band frequency.

* * * * *